(12) United States Patent
Chen

(10) Patent No.: US 7,286,195 B2
(45) Date of Patent: Oct. 23, 2007

(54) INTERCONNECT STRUCTURE FOR TFT-ARRAY SUBSTRATE AND METHOD FOR FABRICATING THE SAME

(75) Inventor: Kun-Hong Chen, Taipei County (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/470,268
(22) Filed: Sep. 6, 2006

(65) Prior Publication Data

US 2007/0002212 A1    Jan. 4, 2007

Related U.S. Application Data

(62) Division of application No. 10/780,932, filed on Feb. 17, 2004, now Pat. No. 7,119,411.

(51) Int. Cl.
*G02F 1/133* (2006.01)
(52) U.S. Cl. ............... 349/73; 257/E51.005; 257/758; 257/449; 438/609; 349/187
(58) Field of Classification Search ........ 257/E51.005, 257/E33.064, E31.126, E29.151, E23.157, 257/E27.111, 758, 449, 749, 347, 79; 438/609; 349/73, 187
See application file for complete search history.

(56) References Cited

U.S. PATENT DOCUMENTS

| 6,198,517 | B1 | 3/2001 | Ohori et al. |
| 6,362,866 | B1 | 3/2002 | Yamazaki et al. |
| 6,466,281 | B1 | 10/2002 | Huang et al. |
| 6,674,093 | B1 | 1/2004 | Tanaka et al. |
| 6,934,000 | B1 | 8/2005 | Ishii et al. |

*Primary Examiner*—Kenneth Parker
*Assistant Examiner*—Chris C. Chu

(74) *Attorney, Agent, or Firm*—Thomas, Kayden, Horstemeyer & Risley

(57) ABSTRACT

An interconnect structure connecting two isolated metal lines in a non-display area of a TFT-array substrate. A first metal line is disposed on the substrate, covered with a first insulating layer. A second metal line is disposed on the first insulating layer and covered by a second insulating layer. ITO (indium tin oxide) wiring is disposed on the second insulating layer, electrically connecting the first and second metal lines. A passivation structure is disposed on the second insulating layer, with an opening therein to expose and surround the ITO wiring.

5 Claims, 11 Drawing Sheets

INTERCONNECT STRUCTURE FOR TFT-ARRAY SUBSTRATE AND METHOD FOR FABRICATING THE SAME

This application is a division of U.S. patent application Ser. No. 10/780,932, filed Feb. 17, 2004, now U.S. Pat. No. 7,119,411, issued Oct. 10, 2006.

BACKGROUND OF THE INVENTION

1. Field of the Invention

The present invention relates to a circuit layout of a flat display panel, and in particular to an interconnect structure for peripheral circuits on a thin film transistor (TFT) array substrate for a flat display panel.

2. Description of the Related Art

Currently, flat panel displays are widely used in various applications with liquid crystal displays (LCDs) a popular choice. A typical TFT-LCD panel comprises an upper and a lower substrate with liquid crystal materials filled therebetween. The upper substrate (in cross-section) is typically known as a color filter substrate and the lower substrate an array substrate having thin film transistors (TFTs) fabricated thereon. A backlight unit is located at the back of the panel. When voltage is applied to a transistor, the alignment of the liquid crystal is altered, allowing light to pass through to form a pixel. The front substrate, i.e. the color filter substrate, gives each pixel its own color. The combination of these pixels in different colors forms images on the panel.

In addition to the TFT array formed on the display area, peripheral circuits are also disposed on the non-display area of the lower substrate, such as driving circuits, scanning circuits and electrostatic discharge (ESD) protection circuits. In the production process of a TFT-array substrate, it is important to effectively protect thin film transistors from damaged by electrostatic charges, thus ESD protection circuits are generally formed on the non-display area to discharge electrostatic charges induced in the circuits during TFTs fabrication.

FIG. 1 is a top view of part of a peripheral circuit for ESD protection in a non-display area of a TFT array substrate. Three parallel metal lines 110, e.g. gate metal lines, opposite to three parallel metal lines 130, e.g. source/drain metal lines, are disposed on the non-display area of a TFT array substrate 100. Each metal line 110 is bridged to the opposite metal line 130, utilizing ITO layers 162 as the wirings. Two passivation layers 151 and 152, parallel to each other, are disposed on opposite sides of the bridging regions, with a trench therebetween exposing the ITO wirings 162.

FIGS. 2A to 2E are cross-sections of FIG. 1 along line 1-1, showing the process for connecting one set of corresponding metal lines 110 and 130. As shown in FIG. 2A, a metal line 110 is disposed on the non-display area of TFT array substrate 100. The metal line 110 can be simultaneously formed with gate metal lines of the TFT array on the display area of substrate 100. An insulating layer 120 is then formed, covering the metal line 110 and the exposed surface of the substrate 100. Another metal line 130 is then formed on the insulating layer 120, close to the metal line 110. The metal line 130 can be simultaneously formed with source/drain metal lines of the TFT array on the display area of substrate 100. A second insulating layer 140 is formed, covering the metal line 130 and the insulating layer 120. Conventionally, the thicknesses of the metal lines 110 and 130 are about 2500 Å, and those of the insulating layer 120 and 140, 3000 Å, approximately. A thick passivation layer 150 is then formed on the surface of the insulating layer 140, with a thickness of 3-4 μm.

The thick passivation layer 150 is then patterned to form two passivation layers 151 and 152 as shown in FIG. 1, exposing a long strip of insulating layer 140 above where the metal lines 110 and 130 will be interconnected. The insulating layer 140 therebetween is further patterned to form two via holes 141 and 142, exposing the underlying metal lines 110 and 130 respectively, as shown in FIG. 2B.

An ITO (indium tin oxide) layer 160, of a conductive material, is then deposited on the surface of substrate 100, substantially filling via holes 141 and 142 to form wiring between metal lines 110 and 130. A thick photoresist layer 170 is then deposited over the surface of the ITO layer 160, at a thickness of about 1.5 μm in the central area of the ITO layer 160 between the two passivation layers 151 and 152. However, due to the thick passivation layers 151 and 152 and the fluidity of photoresist, the photoresist layer 170 on the ITO layer 160 at the foot of the passivation layers 151 and 152 may be as thick as 3 μm or more, as shown in FIG. 2C.

The photoresist layer 170 is then patterned to form a rectangular mask 172 covering the ITO layer 160 between the passivation layers 151 and 152, thereby exposing the rest of the ITO layer 160, as shown in FIG. 2D. However, the overly thick photoresist layer 170 at the foot of the passivation layers 151 and 152 may not be removed thoroughly, such that photoresist residue 170' remains along the foot of the passivation layers 151 and 152, thereby covering two strips of ITO layer 160.

The uncovered ITO layer is then etched and removed using the patterned photoresist layer 172 as a mask. Due to the photoresist residue 170' also covering the ITO layer 160 along the foot of the passivation layers 151 and 152, the ITO layers covered by the photoresist residue 170' are not removed. After the photoresist mask 172 and residue 170' are removed, an ITO wiring 162 is formed to connect the corresponding metal lines 110 and 130, as shown in FIG. 2E. In addition to the ITO wirings 162 for the connection of every set of corresponding metal lines 110 and 130, two strips of remnant ITO layers 160' also form along the foot of the two passivation layers 151 and 152, as shown in FIG. 1. If the remnant ITO layer 160' extends to contact the central ITO wiring 162, the parallel metal lines 110 and 130 nearby may all connect, resulting in a short circuit.

SUMMARY OF THE INVENTION

The primary object of the invention is to prevent ITO wirings from shorting with other circuits or wires, especially applied to peripheral circuits in a non-display area of a TFT-array substrate for a flat panel display. To achieve the object, the present invention provides an interconnect structure disposed on a TFT-array substrate. According to the invention, a first line is disposed on a TFT-array substrate and a first insulating layer covers the first metal line. A corresponding second metal line is disposed on the first insulating layer and covered by a second insulating layer. ITO (indium tin oxide) wiring is disposed on the second insulating layer, electrically connecting the first and second metal lines with two ITO electrodes. A passivation structure is disposed on the second insulating layer, exposing and enclosing the ITO wiring.

The present invention further provides a method for fabricating the interconnect structure to prevent ITO wiring shorts. According to the invention, the passivation structure is ring-like to encircle the area for ITO wiring, without overlapping or crossing any conductive lines other than the first and second metal lines, thereby preventing ITO wiring shorts in the subsequent process.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers.

Figure 1:
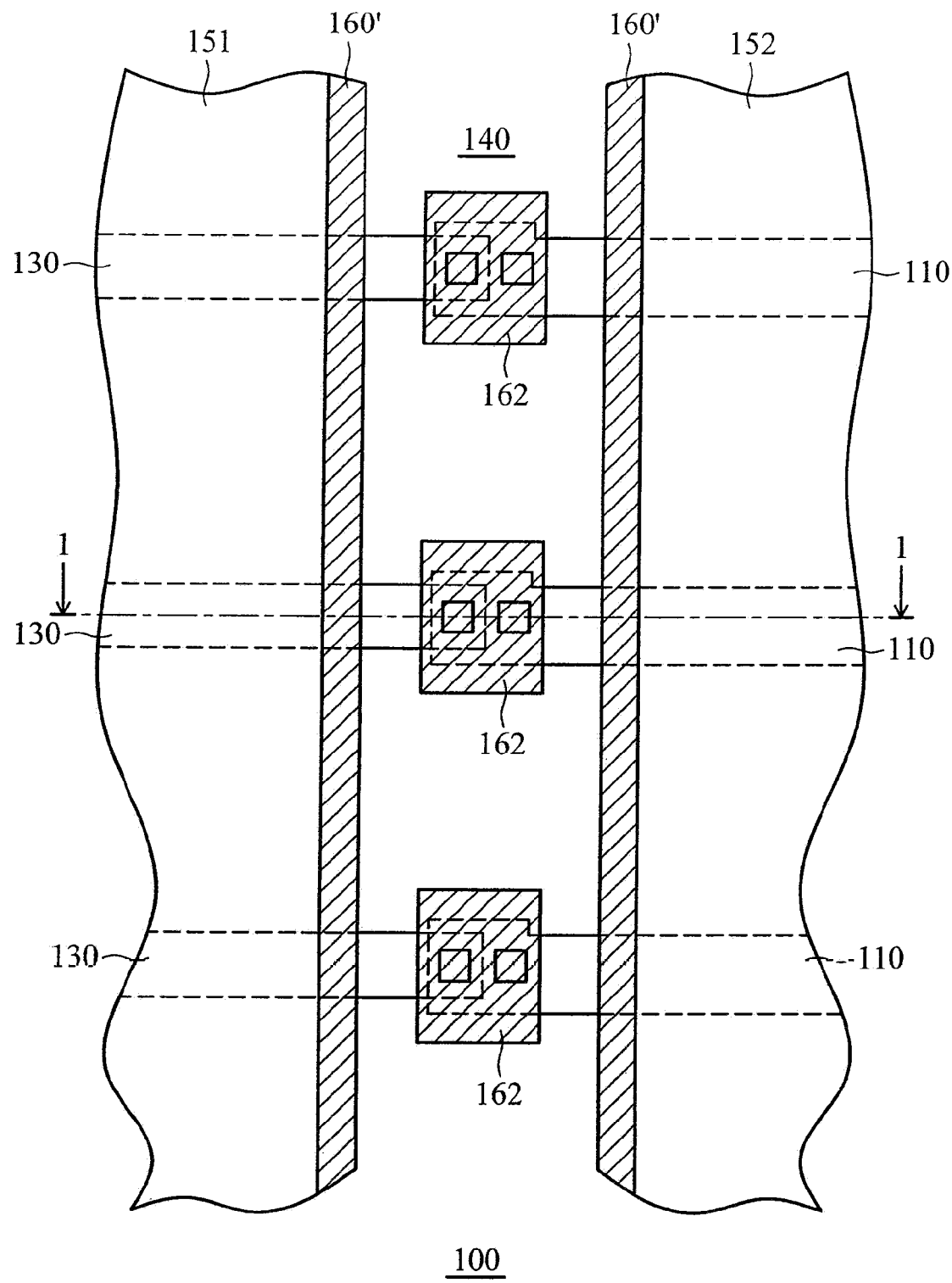
FIG. 1 is a top view of part of a conventional peripheral circuit in a non-display area of a TFT array substrate.
Figure 2A:
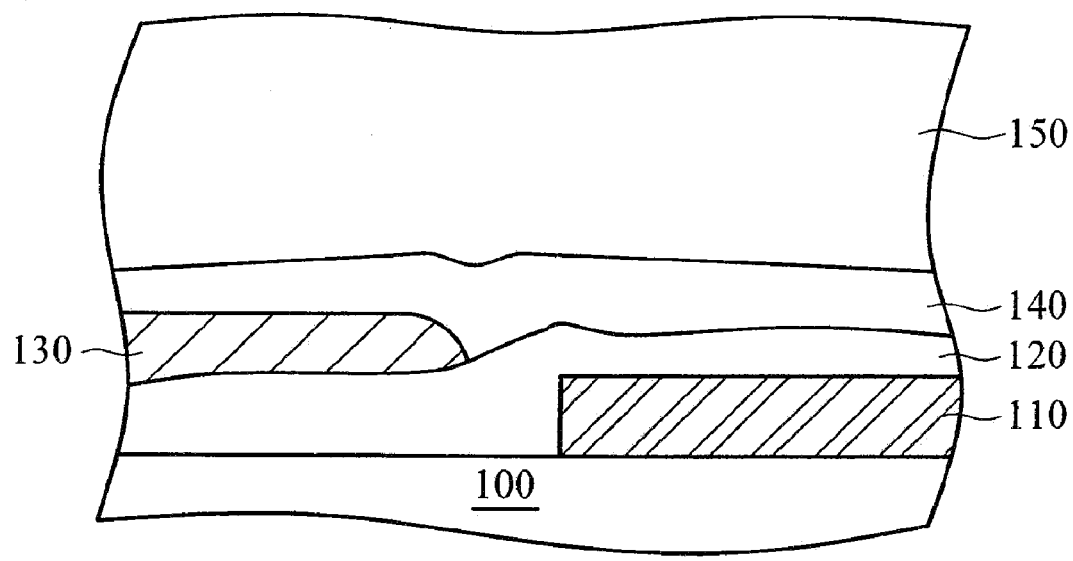
FIGS. 2A to 2E are cross-sections of FIG. 1 along line 1-1, showing a conventional process for fabrication of the interconnect structure.
Figure 2B:
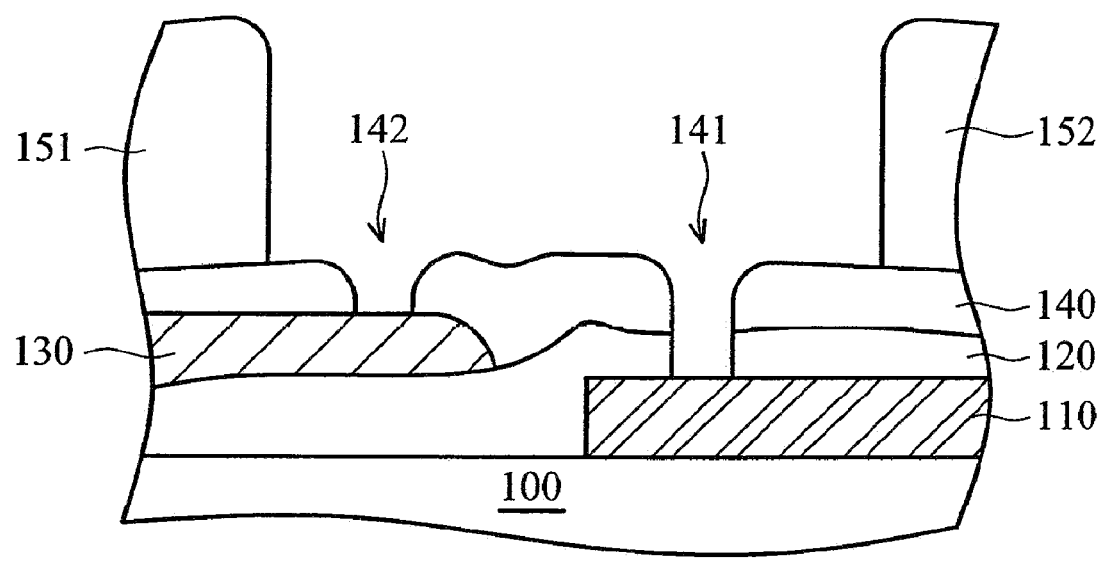
Figure 2C:
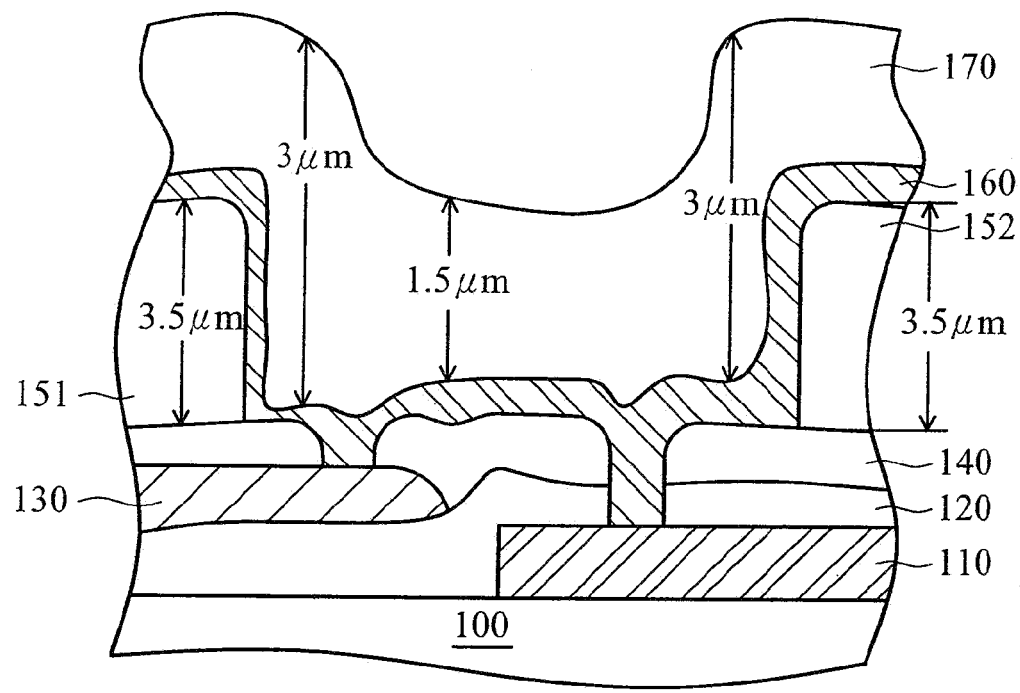
Figure 2D:
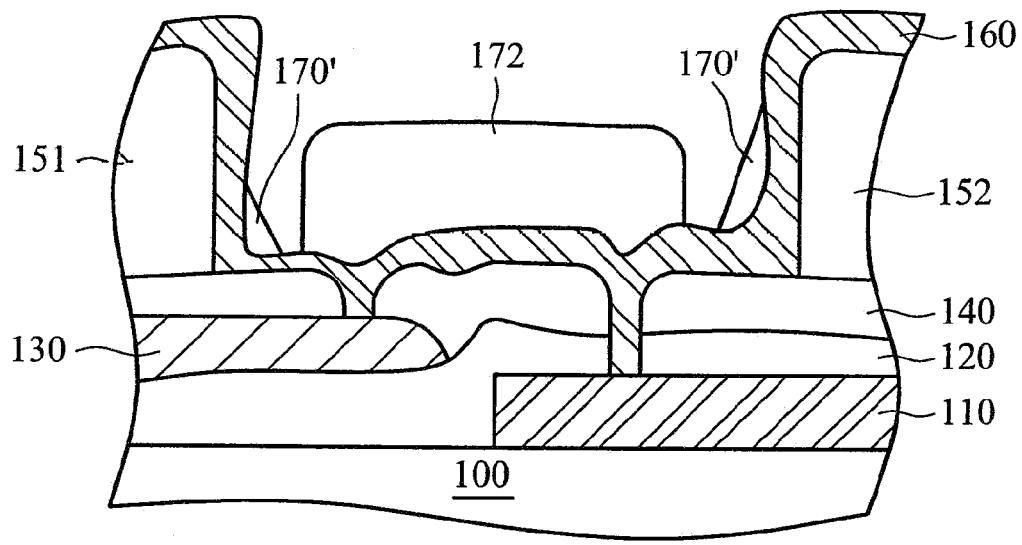
Figure 2E:
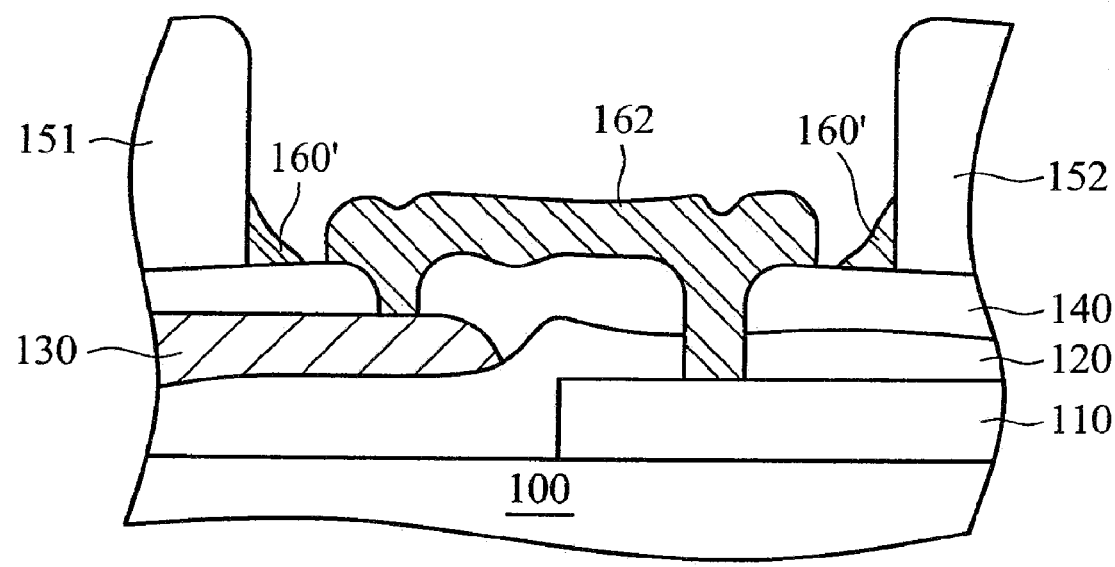
Figure 3:
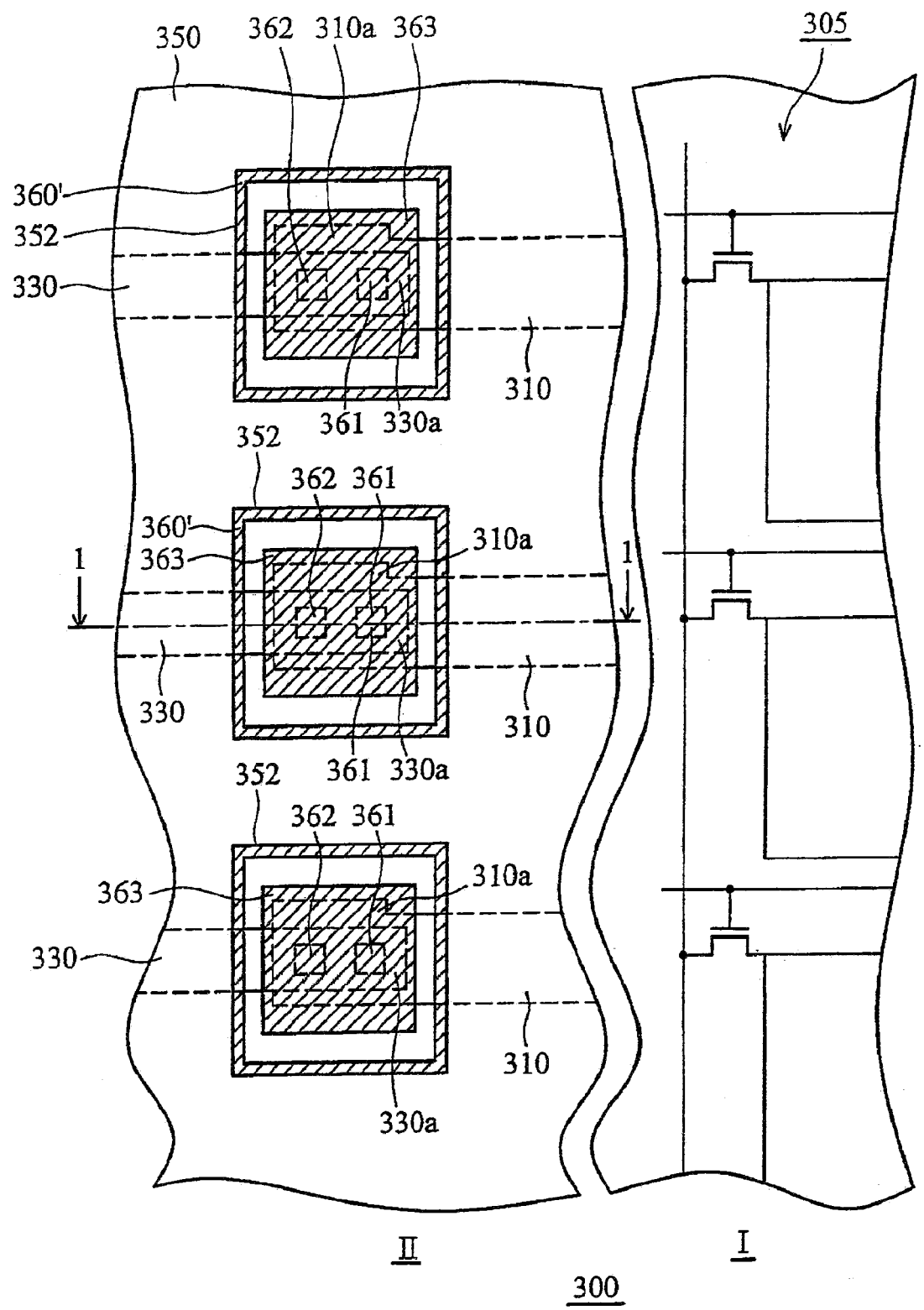
FIG. 3 is a top view of part of a peripheral circuit in a non-display area of a TFT array substrate of the invention.

FIG. 3 is a top view of an interconnect structure according to one embodiment of the invention. A rear glass substrate 300 for an LCD panel is provided, and divided into a display area I and a non-display area II. A TFT array 305 is disposed in the display area I and a peripheral circuit is disposed in the non-display area II, partially shown in FIG. 3. The peripheral circuit includes three sets of interconnect structures. Each interconnect structure includes a metal line 310 and a corresponding metal line 330, isolated from each other with an inter-metal insulating layer. The term "corresponding" or "correspondent" herein represents the two metal lines connecting in subsequent process. Preferably, one end 310a of the metal line 310 overlaps with, crosses, or is close to one end 330a of the metal line 330 for interconnection. A passivation structure 350 is disposed on the surface of the substrate 300 with an opening 352 therein, exposing and enclosing where the metal lines 310 and 330 will be connected. Inside the opening 352 of the passivation structure 350, the end 310a of the metal line 310 and the end 330a of the metal line 330 are connected by ITO wiring 363, which comprises ITO electrodes 361 and 362 in contact with the metal lines 310 and 330 respectively. As shown in FIG. 3, the opening 352 of the passivation structure 350 can be rectangular. However, the opening in the passivation structure 350 can be formed in other enclosed shapes and the invention is not limited thereto.

Figure 4A:
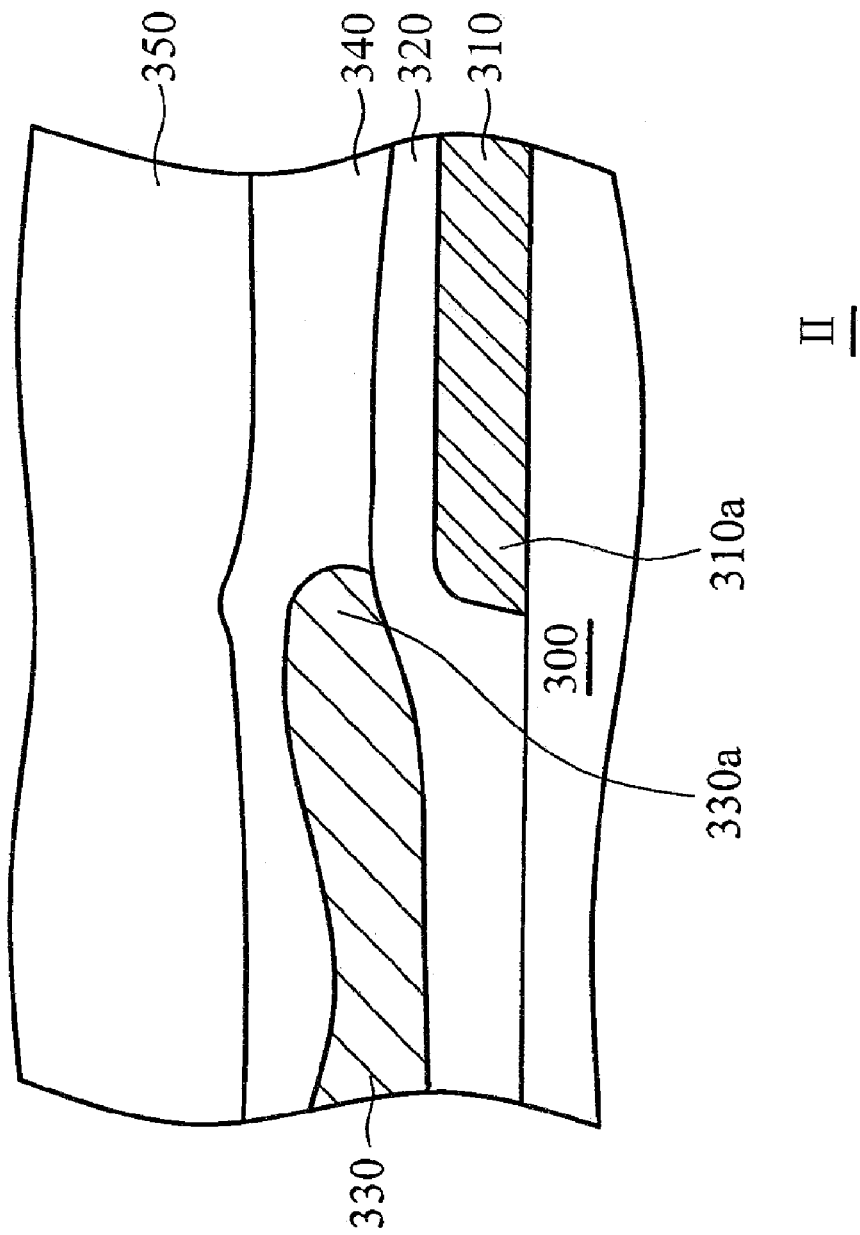
FIGS. 4A to 4F are cross-sections of FIG. 3 along line 1-1, showing a fabrication process of the interconnect structure of the invention.
Figure 4B:
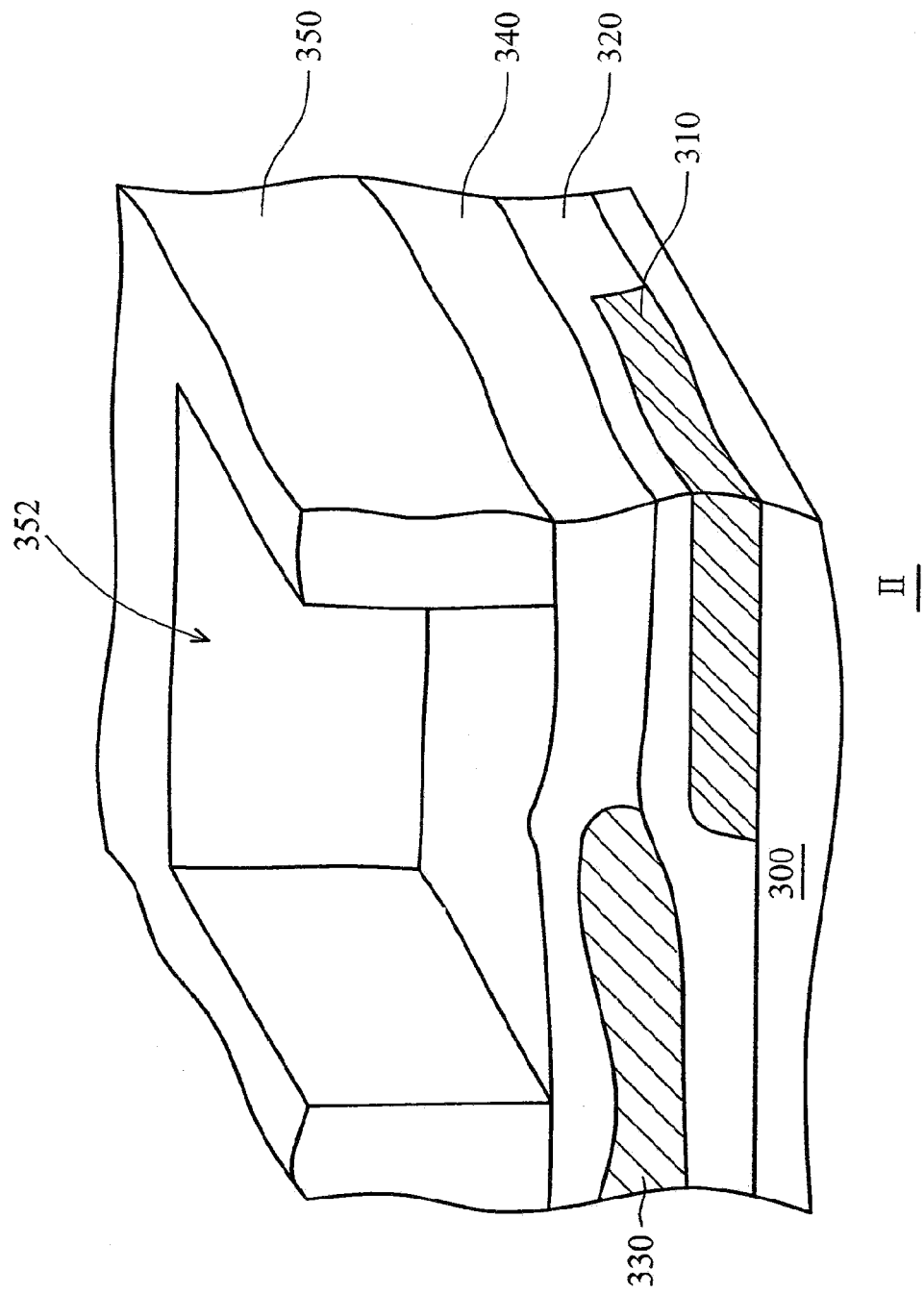

FIGS. 4A to 4F are cross-sections of FIG. 3 along line 1-1, showing the fabrication process of the interconnect structure in the non-display area II of the TFT-array substrate 300. As shown in FIG. 4A, a metal line 310 is disposed in the non-display area II of TFT array substrate 300. The metal line 310 can be simultaneously formed with gate metal lines, e.g. a Ti—Al—Ti laminated layer of a thickness about 2500 Å, of the TFT array on the display area of substrate 300. An insulating layer 320, e.g. a SiNx layer of a thickness about 3000 Å, is then formed, covering the metal line 310 and the exposed surface of the substrate 300. Another metal line 330 is then formed on the insulating layer 320. Preferably, one end (310a) of the metal line 310 overlaps with, crosses, or is close to one end (330a) of the metal line 330 for subsequent interconnection. The metal line 330 can be simultaneously formed with source/drain metal lines of the TFT array in the display area I of substrate 300, which can be a Ti—Al—Ti laminated layer of a thickness about 2500 Å. Another insulating layer 340 is then formed, covering the metal line 330 and the insulating layer 320. The insulating layer 340 can also be a SiNx layer with thickness about 3000 Å. After the metal lines 310 and 330 are formed, a passivation layer 350 is deposited on the insulating layer 340. A thick passivation layer 350 is formed to cover the surface of the insulating layer 340, preferably an organic layer with a thickness of 3-4 μm.

The thick passivation layer 350 is then patterned with an opening 352 therein that exposes and encloses the area where the metal lines 310 and 330 will be interconnected. The passivation layer 350 can also be patterned to form a rectangular opening 352 shown in FIG. 4B, or other patterns, such as other enclosed shapes. The enclosed opening of the passivation structure herein indicates the opening only exposes the region where only one set of the metal lines 310 and 330 will be interconnected in subsequent process.

Figure 4C:
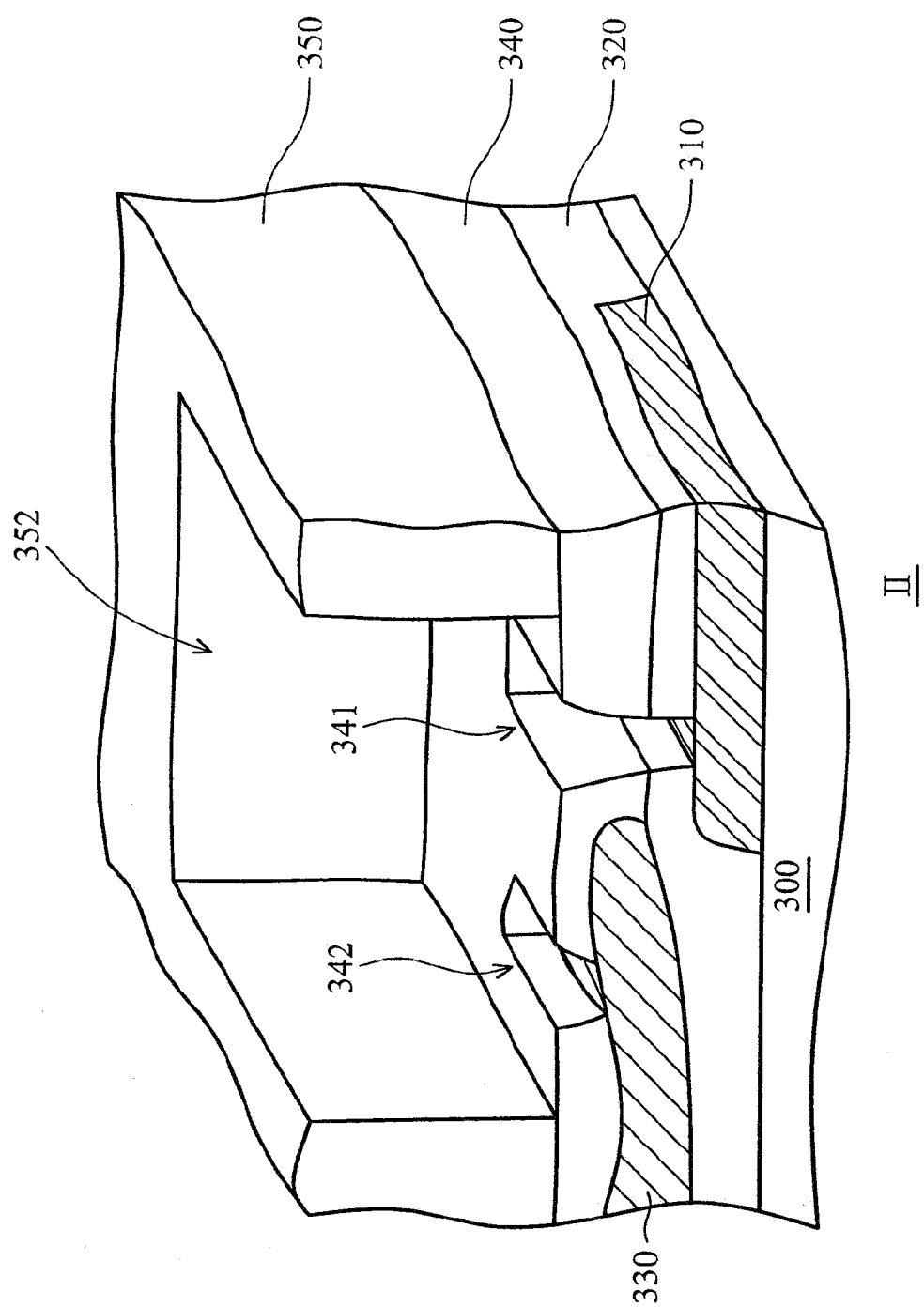

As shown in FIG. 4C, inside the opening 352 of the passivation structure 350, via hole 341 is formed in the exposed insulating layers 340 and 320 to expose the underlying metal line 310, and via hole 342 is formed in the insulting layer 340 to expose the underlying metal line 330.

Figure 4D:
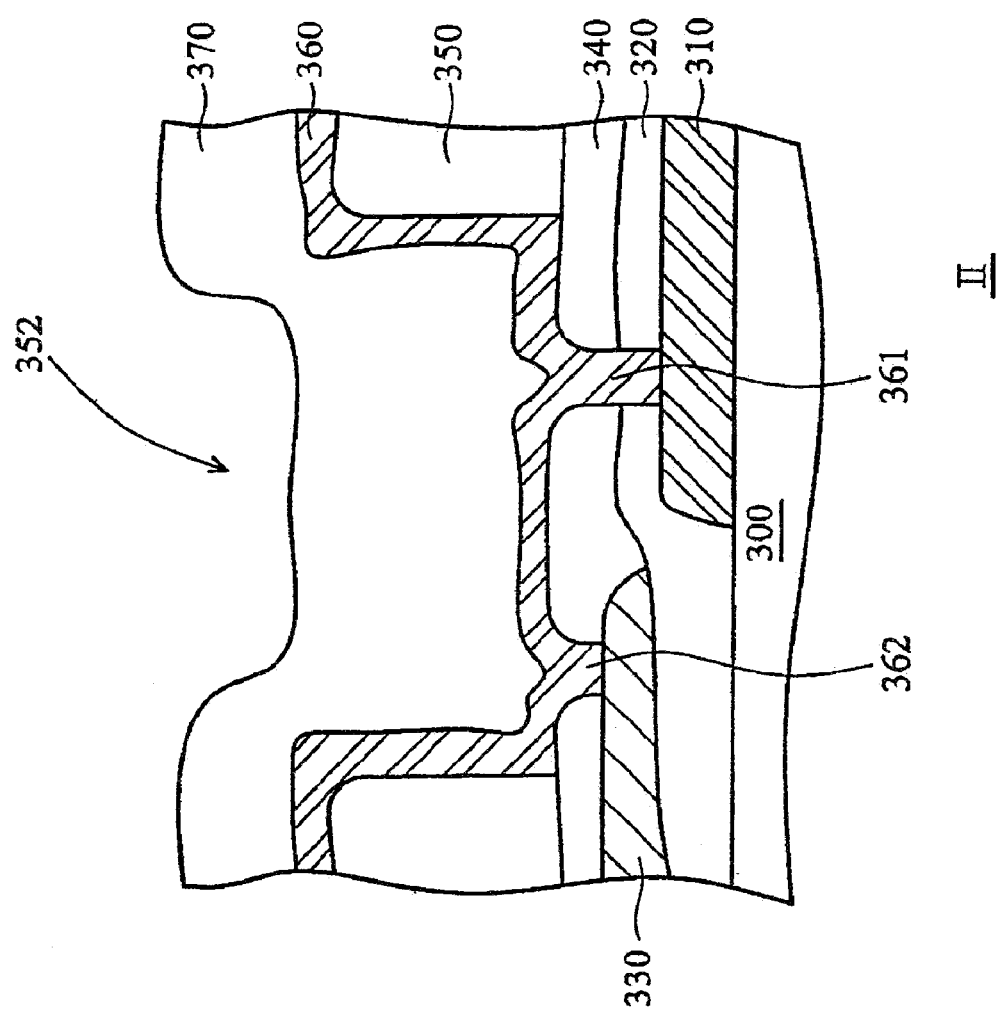

As shown in FIG. 4D, a conductive layer, ITO (indium tin oxide), 360 is formed over the surface of the insulating layer 340 and the passivation layer 352 and substantially fills via holes 341 and 342 to form ITO electrodes 361 and 362 respectively. The ITO layer 360 can be formed by sputtering, simultaneously with the pixel electrode-formation on the display area I of the TFT-array substrate 300. After the ITO layer 360 is formed, a thick photoresist layer 370 is then deposited at a thickness about 3-4 μm on the ITO layer 360.

Figure 4E:
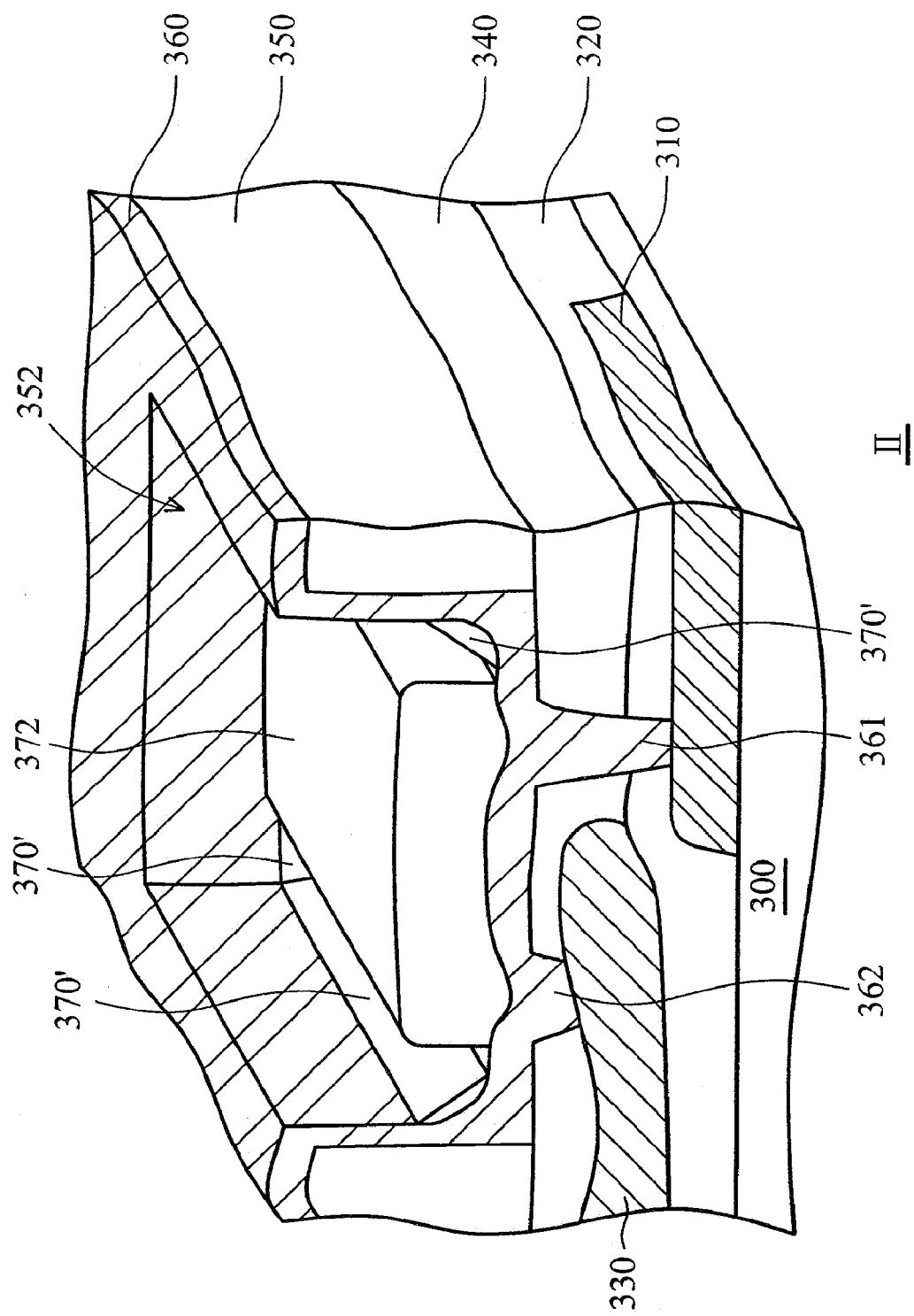

The photoresist layer 370 is patterned by way of photolithography to form a mask covering an area inside the opening 352 of the passivation structure 350, where ITO wiring will be formed. However, because the photoresist layer 370 is thick along the inner foot of opening 352 due to the height difference between the passivation structure 350 and the exposed insulating layer 340, some photoresist may remain along the inner foot of the passivation structure 352 to form residual photoresist layer 370' after photolithography, as FIG. 4E shows.

Figure 4F:
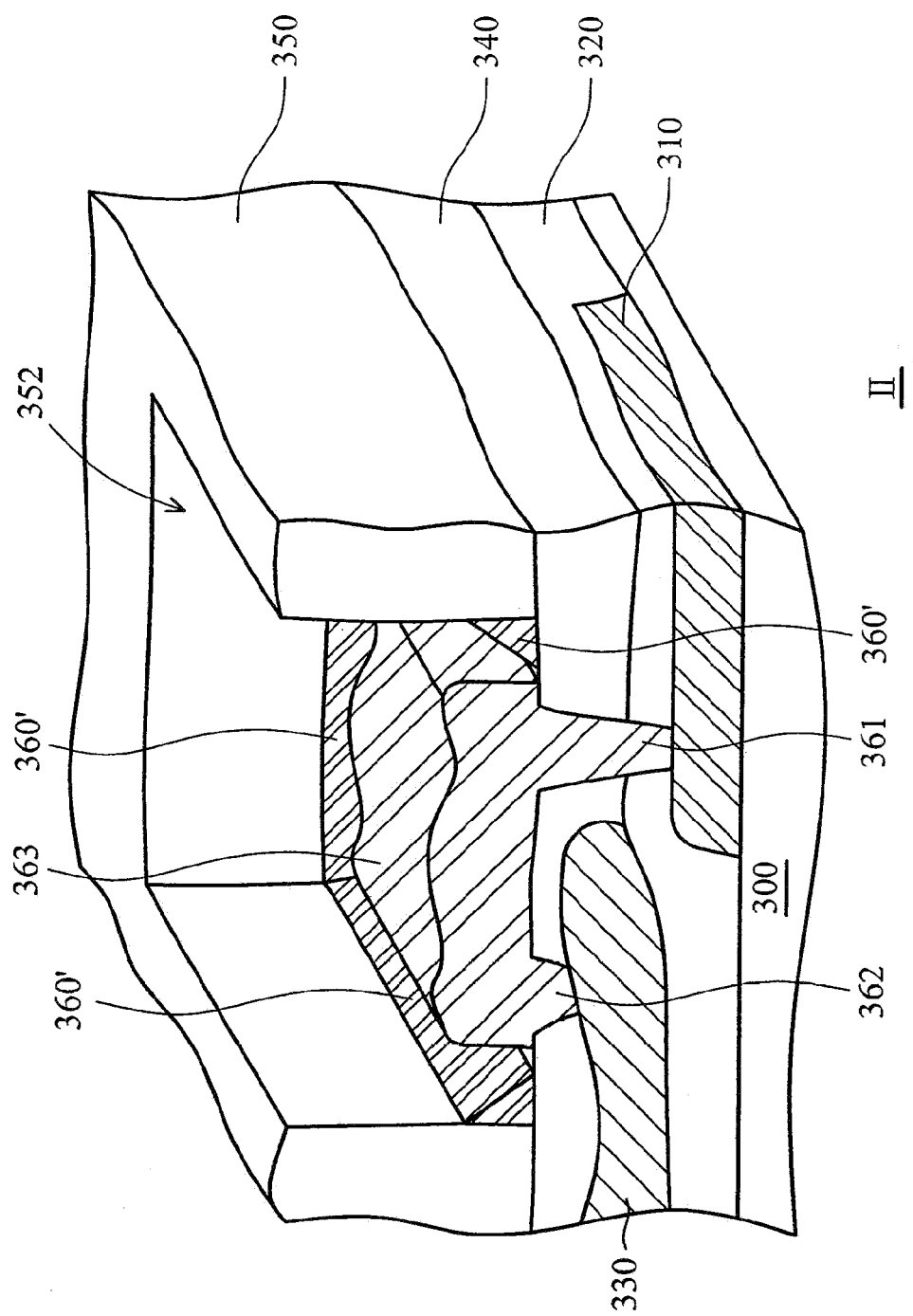

The ITO layer 360 is then etched using the patterned photoresist layer 372 as a mask. The ITO layer 360 can be etched utilizing wet etching with oxalic acid solution as an etchant. After the photoresist 372 is removed, ITO wiring 363 is formed, comprising ITO electrodes 361 and 362 to connect the metal lines 310 and 330. However, if there is residual photoresist 370', a residual ITO ring 360' remains along the inner foot of the opening 352 of the passivation structure 350 as shown in FIG. 4F. Even if the residual ITO ring 360' extends to contact the ITO wiring 363 due to photoresist residue 370', the enclosed opening 352 of the passivation structure 350 isolates the inner ITO wiring from connecting with any conductive layer outside the passivation structure 350, thereby preventing ITO wiring shorting with outside conductive layers. As well, the inner each ITO wiring is isolated from connected with any conductive layer outside the passivation structure by surrounding walls of the passivation structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an interconnect structure on a TFT-array substrate of a flat panel display, comprising:

forming a plurality of first metal lines in a non-display area of the TFT-array substrate;

forming a first insulating layer on the TFT-array substrate to cover the first metal lines;

forming a plurality of second metal lines on the first insulating layer, wherein each second metal line corresponds with one first metal line;

forming a second insulating layer covering the second metal lines and the first insulating layer;

forming a passivation structure on the second insulating layer with openings therein to expose one end of every first and its corresponding second metal lines;

forming a plurality of first and second via holes in the first and second insulating layers inside the opening of the passivation structure to expose the first and second metal lines respectively;

forming an ITO (indium tin oxide) layer on the second insulating layer, filling the first and second via holes to connect the first and second metal lines;

forming a patterned photoresist layer on the ITO layer, masking the ITO layer inside the opening of the passivation structure;

etching the ITO layer with the patterned photoresist layer as a mask to form ITO wiring to connect the first metal line with the second metal line, remaining a residual ITO ring along an inner foot of the opening; and removal of the remaining photoresist layer.

2. The method as claimed in claim 1, wherein the second metal line is formed simultaneously with source/drain metal lines formed in a display area of the TFT-array substrate.

3. The method as claimed in claim 1, wherein the thickness of the passivation structures is between 3 and 4 μm.

4. The method as claimed in claim 1, wherein the opening of the passivation structure is rectangular.

5. The method as claimed in claim 1, wherein the first metal line is formed simultaneously with gate metal lines formed in a display area of the TFT-array substrate.

* * * * *